United States Patent
Kusunoki et al.

(10) Patent No.: US 9,027,588 B2
(45) Date of Patent: May 12, 2015

(54) PRESSURE CONTROL DEVICE

(75) Inventors: Mari Kusunoki, Mie (JP); Takuo Ohashi, Mie (JP); Shinji Miyazaki, Mie (JP); Norihiko Kamiura, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 468 days.

(21) Appl. No.: 13/454,330

(22) Filed: Apr. 24, 2012

(65) Prior Publication Data

US 2012/0273706 A1 Nov. 1, 2012

(30) Foreign Application Priority Data

Apr. 28, 2011 (JP) ................................. 2011-102123
Oct. 3, 2011 (JP) ................................. 2011-218868

(51) Int. Cl.
| | | |
|---|---|---|
| G05D 16/20 | (2006.01) | |
| F16K 31/10 | (2006.01) | |
| F16K 31/04 | (2006.01) | |
| F16K 31/44 | (2006.01) | |
| H01L 21/67 | (2006.01) | |

(52) U.S. Cl.
CPC ............ *G05D 16/2013* (2013.01); *F16K 31/10* (2013.01); *F16K 31/04* (2013.01); *F16K 31/445* (2013.01); *H01L 21/67253* (2013.01)

(58) Field of Classification Search
CPC ....... F16K 31/04; F16K 31/10; F16K 31/445; H01L 21/67253; G05D 16/2013
USPC .................. 137/487.5; 251/229, 273, 129.01, 251/129.04, 129.11
See application file for complete search history.

(56) References Cited

U.S. PATENT DOCUMENTS

| | | | |
|---|---|---|---|
| 4,921,207 A * | 5/1990 | Baker ............................. | 251/14 |
| 4,948,091 A * | 8/1990 | Satoh et al. ...................... | 251/65 |
| 5,611,491 A | 3/1997 | Bowers | |
| 2006/0071190 A1* | 4/2006 | Pfister ........................ | 251/129.11 |

FOREIGN PATENT DOCUMENTS

| | | |
|---|---|---|
| JP | 61-144819 | 7/1986 |
| JP | 11-116380 | 4/1999 |
| JP | 2004-275859 | 10/2004 |
| JP | 3952556 | 5/2007 |

OTHER PUBLICATIONS

Japanese Office Action issued Jul. 22, 2014 in Patent Application No. 2011-102123 with English Translation.

* cited by examiner

*Primary Examiner* — William McCalister
*Assistant Examiner* — Michael R Reid
(74) *Attorney, Agent, or Firm* — Oblon, McClelland, Maier & Neustadt, L.L.P.

(57) ABSTRACT

A pressure control device according to an embodiment includes a solenoid portion for regulating a gate opening of a valve through a first shaft portion connected to the valve, a micrometer for regulating the gate opening through the first shaft portion and a second shaft portion having an axial direction which is parallel with that of the first shaft portion when the second shaft portion is connected to the first shaft portion, and a switching portion. The switching portion switches to cause the solenoid portion to regulate the gate opening or to cause the micrometer to regulate the gate opening.

8 Claims, 11 Drawing Sheets

PRESSURE CONTROL DEVICE

CROSS-REFERENCE TO RELATED APPLICATIONS

This application is based upon and claims the benefit of priority from Japanese Patent Application No. 2011-102123, filed on Apr. 28, 2011 and Japanese Patent Application No. 2011-218868, filed on Oct. 3, 2011; the entire contents all of which are incorporated herein by reference.

FIELD

Embodiments described herein relate generally to a pressure control device.

BACKGROUND

In a semiconductor manufacturing apparatus to be used for manufacturing a semiconductor device, it is necessary to accurately control a gas pressure when causing a process gas to flow into a process chamber.

In pressure control using a solenoid valve, however, a variation in the pressure control is generated every semiconductor manufacturing apparatus. For this reason, there is a problem in that it is hard to carry out precise pressure control.

DETAILED DESCRIPTION

According to embodiments, there is provided a pressure control device. The pressure control device includes a valve for regulating a gate opening between an upstream side gas pipe and a downstream side gas pipe, thereby regulating a gas pressure in the upstream side gas pipe or the downstream side gas pipe, and a first shaft portion connected to the valve. Moreover, the pressure control device includes a solenoid portion for moving the first shaft portion in an axial direction through solenoid driving, thereby regulating a gate opening through the first shaft portion, and a micrometer, or unit, connected to a second shaft portion having an axial direction which is parallel with that of the first shaft portion and moving the second shaft portion in the axial direction by means of a screw mechanism, thereby regulating the gate opening through the first and second shaft portions. Furthermore, the pressure control device includes a control unit for controlling the solenoid portion and the micrometer in such a manner that the gas pressure in the upstream side gas pipe or the downstream side gas pipe is a desirable gas pressure, and a switching portion for switching to regulate the gate opening through the solenoid portion or to regulate the gate opening through the micrometer based on an instruction sent from the control unit.

With reference to the accompanying drawings, the pressure control device according to the embodiments will be described below in detail. The present invention is not restricted to these embodiments.

First Embodiment

Figure 1:
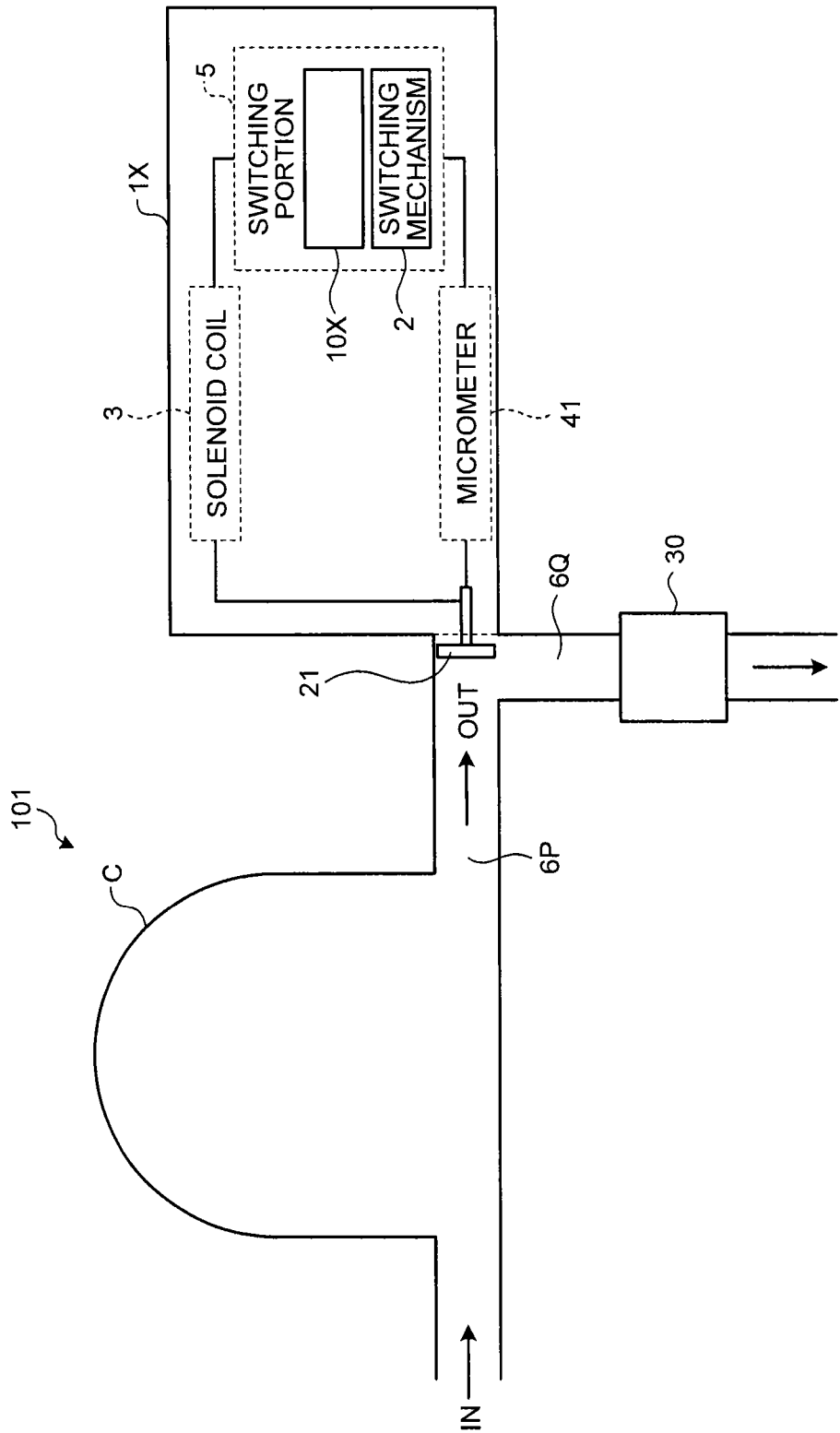
FIG. 1 is a diagram showing a structure of a semiconductor manufacturing apparatus including a pressure control device according to a first embodiment.

FIG. 1 is a diagram showing a structure of a semiconductor manufacturing apparatus including a pressure control device according to a first embodiment. A semiconductor manufacturing apparatus 101 includes a process chamber C, a pipe (an upstream side gas pipe) 6P, a pressure control device 1X, a pipe (a downstream side gas pipe) 6Q, and a discharge pump 30. The pressure control device 1X according to the present embodiment controls a gas pressure in a pipe by means of a micrometer if the gas pressure in the pipe is lower than a predetermined value, and controls the gas pressure in the pipe by means of a solenoid coil if the gas pressure in the pipe is higher than the predetermined value.

The process chamber C is a processing chamber for forming a thin film on a substrate (wafer) on which a semiconductor device (a semiconductor integrated circuit) is to be formed with respect to the wafer. A process gas is introduced in a vacuum state into the process chamber C so that the thin film is formed on the wafer. A gas is discharged in a predetermined amount as an exhaust gas from the process chamber C. The exhaust gas discharged from the process chamber C is fed to the discharge pump 30 through the pipes 6P and 6Q, and is fed to an outside (an exhaust gas processing device) or the like through the discharge pump 30.

In the semiconductor manufacturing apparatus 101, the pressure control device 1X is provided between the pipe 6P and the pipe 6Q. A gas pressure in the pipe 6P is controlled by the pressure control device 1X. When the gas pressure in the pipe 6P is controlled, a process gas pressure in the process chamber C is controlled.

The pressure control device 1X according to the present embodiment has a valve 21, a solenoid coil 3, a micrometer 41, and a switching portion 5. The solenoid coil 3 moves the valve 21 in the pipes 6P and 6Q in an axial direction through solenoid driving, thereby regulating a flow rate of the exhaust gas from the pipe 6P to the pipe 6Q. The micrometer 41 moves the valve 21 in the axial direction by means of a screw mechanism, thereby regulating an amount of discharge of the gas from the pipe 6P to the pipe 6Q.

The switching portion 5 switches the control of the valve 21 through the solenoid coil 3 and that of the valve 21 through the micrometer 41. The switching portion 5 operates the valve 21 by means of the micrometer 41 when the exhaust gas is to be discharged in a small amount from the pipe 6P to the pipe 6Q, and operates the valve 21 by means of the solenoid coil 3 when the exhaust gas is to be discharged in a large amount from the pipe 6P to the pipe 6Q.

By the structure, an exhaust gas pressure can be controlled precisely by means of the micrometer 41 when the exhaust gas is to be discharged in a small amount, and the exhaust gas pressure can be controlled at a high speed by means of the solenoid coil 3 when the exhaust gas is to be discharged in a large amount.

Figure 2:
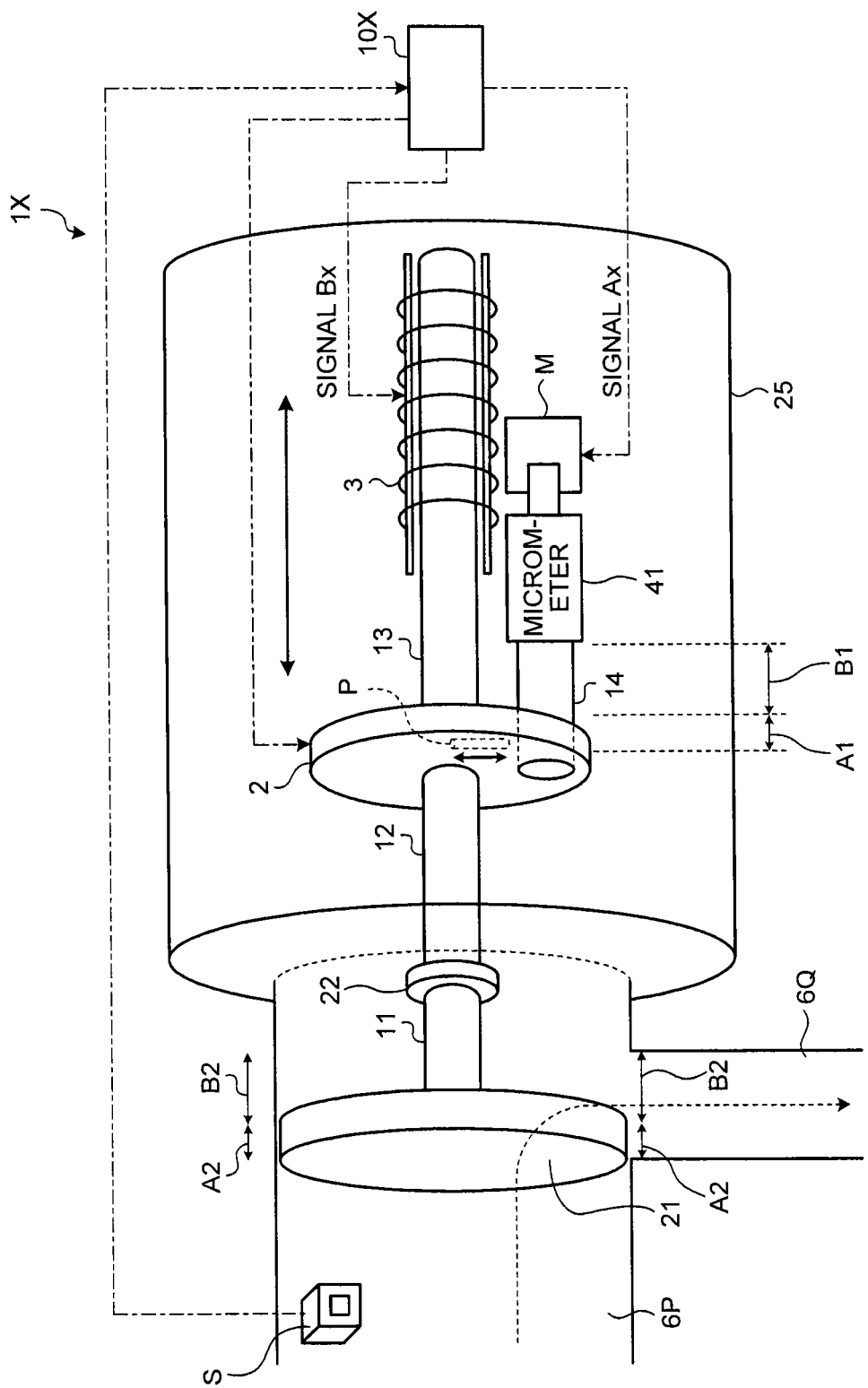
FIG. 2 is a view showing a structure of the pressure control device according to the first embodiment.

Next, a structure of the pressure control device 1X will be described. FIG. 2 is a view showing a structure of the pressure control device according to the first embodiment. The pressure control device 1X is disposed between the pipe 6P and the pipe 6Q and controls the flow rate of the exhaust gas from the pipe 6P to the pipe 6Q.

The pressure control device 1X includes a housing 25, shaft portions 11, 12, 13 and 14, the solenoid coil 3, the valve 21, a vacuum shield 22, a switching mechanism 2, a microcomputer (control unit) 10X, the micrometer 41, and a motor M.

The shaft portions 11, 12 and 13 are formed integrally by a bar-shaped member so as to be arranged coaxially, and the valve 21 is disposed on one of tip parts (a left end of the shaft portion 11 in FIG. 2). The shaft portions 11 to 13 are moved in an axial direction of the shaft portions 11 to 13 (a transverse direction in the drawing) to move the valve 21 in the axial direction of the shaft portion 11.

Moreover, the shaft portion 14 is formed by a bar-shaped member so as to be arranged in a parallel direction with the shaft portions 11 to 13. The shaft portion 14 is moved in an axial direction of the shaft portion 14 (the transverse direction in the drawing) to move the valve 21 in the axial direction of the shaft portion 11.

The valve 21 is moved in the axial direction of the shaft portions 11 to 13 in the pipes 6P and 6Q to regulate an amount of a clearance between the pipe 6P and the pipe 6Q. For example, the valve 21 is moved to a left side in the drawing so that the clearance (a gate opening) between the pipe 6P and the pipe 6Q is reduced. Consequently, the flow rate of the exhaust gas flowing from the pipe 6P to the pipe 6Q is decreased. As a result, a pressure in the process chamber C is raised. Moreover, the valve 21 is moved toward a right side in the drawing so that the clearance between the pipe 6P and the pipe 6Q is increased. Consequently, the flow rate of the exhaust gas flowing from the pipe 6P to the pipe 6Q is increased. As a result, the pressure in the process chamber C is decreased.

The vacuum shield 22 is disposed in a bonding position in which the pipes 6P and 6Q and the housing 25 are bonded to each other. The vacuum shield 22 has a through hole for causing the shaft portions 11 and 12 to penetrate therethrough, and the shaft portions 11 and 12 are inserted into the through hole so as to freely penetrate therethrough (so as to be freely inserted therein). The vacuum shield 22 is constituted to enable the movement of the shaft portions 11 and 12 in the axial direction while maintaining airtight in such a manner that the flow-out/in of a gas between the pipes 6P and 6Q and the housing 25 is not caused. In the present embodiment, for convenience of explanation, description will be given on the assumption that the shaft portion between the vacuum shield 22 and the valve 21 is set to be the shaft portion 11 and the shaft portion between the vacuum shield 22 and the switching mechanism 2 is set to be the shaft portion 12.

The switching mechanism 2 is constituted by using an almost disc-like member taking a shape of a plate. The switching mechanism 2 is disposed between the shaft portions 12 and 13 in such a manner that a main surface thereof crosses the axial direction of the shaft portions 12 and 13. The switching mechanism 2 has a first through hole for causing the shaft portions 12 and 13 to penetrate therethrough, and the shaft portions 12 and 13 are inserted in the first through hole and the switching mechanism 2 is fixed to the shaft portions 12 and 13 via the first through hole. The solenoid coil 3 is wound upon a right end of the shaft portion 13.

Moreover, the switching mechanism 2 has a second through hole (a through hole 31 which will be descried below) for causing the shaft portion 14 to penetrate therethrough, and the shaft portion 14 is inserted into the through hole 31 so as to freely penetrate therethrough. The through hole 31 is constituted to be larger than the shaft portion 14. The micrometer 41 is connected to a right end of the shaft portion 14.

The switching mechanism 2 includes a pin portion P therein. The pin portion P is provided in the switching mechanism 2 so as to enable a movement in a perpendicular direction to the axial direction of the shaft portion 14. The switching mechanism 2 inserts the pin portion P into an insertion hole (an insertion hole H which will be described below) provided on the shaft portion 14 with the shaft portion 14 inserted in the through hole 31 when the valve 21 is to be controlled by the micrometer 41. Consequently, the switching mechanism 2 can be moved in the same direction as the shaft portion 14. Moreover, the switching mechanism 2 pulls the pin portion P out of the insertion hole H provided on the shaft portion 14 when the valve 21 is to be controlled by the solenoid coil 3. Thus, the switching mechanism 2 can be moved in the same direction as the shaft portion 13.

The solenoid coil 3 moves the shaft portions 11 to 13 in the axial direction through solenoid driving. The solenoid coil 3 moves the shaft portion 13 in the axial direction in accordance with an instruction (a signal Bx) sent from the microcomputer 10X. The solenoid coil 3 moves the shaft portion 13 to a position corresponding to the signal Bx.

The motor M operates the micrometer 41 in a predetermined amount in accordance with an instruction (a signal Ax) sent from the microcomputer 10X. The micrometer 41 moves the shaft portion 14 in the axial direction by using a rotating power of the motor M. The micrometer 41 moves the shaft portion 14 to a position corresponding to the signal Ax to be sent to the motor M.

The microcomputer 10X sends an instruction to the solenoid coil 3, the motor M and the switching mechanism 2 in such a manner that an inner part of the pipe 6P has a desirable gas pressure based on a pressure value (a gas pressure) given from Baratron sensor S. The Baratron sensor S is provided in the pipe 6P and measures a gas pressure in the pipe 6P.

The housing 25 takes an almost cylindrical shape and stores the shaft portions 12 to 14, the solenoid coil 3, the vacuum shield 22, the switching mechanism 2, the micrometer 41, and the motor M. The housing 25 is connected to the pipes 6P and 6Q through the vacuum shield 22.

In the pressure control device 1X, the switching mechanism 2 transmits an operation of the micrometer 41 and is thus moved in the axial direction of the shaft portions 11 and 12 in a moving area A1. Consequently, the valve 21 is moved in the axial direction of the shaft portions 11 and 12 in a moving area A2. Accordingly, a distance in the moving area A1 is equal to that in the moving area A2.

In the pressure control device 1X, moreover, the switching mechanism 2 is moved in the axial direction of the shaft portions 11 and 12 in a moving area B1 by an operation of the solenoid coil 3. Consequently, the valve 21 is moved in the axial direction of the shaft portions 11 and 12 in a moving area B2. Accordingly, a distance in the moving area B1 is equal to that in the moving area B2.

The moving area A2 is an area in which the valve 21 is moved in the case in which the flow rate of the exhaust gas from the pipe 6P to the pipe 6Q is to be decreased, and the moving area B2 is an area in which the valve 21 is moved in the case in which the flow rate of the exhaust gas from the pipe 6P to the pipe 6Q is to be increased.

When the flow rate of the exhaust gas from the pipe 6P to the pipe 6Q is to be set to 0 to a predetermined amount X, accordingly, the valve 21 is moved in the moving area A2 by the operation of the micrometer 41. For example, the valve 21 is moved to one of ends in the moving area A2 (a left end in FIG. 2) so that the flow rate of the exhaust gas is 0. Moreover, the valve 21 is moved to the other end in the moving area A2 (a right end in FIG. 2) (a boundary position with the moving area B2) so that the flow rate of the exhaust gas is the predetermined amount X.

When the flow rate of the exhaust gas from the pipe 6P to the pipe 6Q is to be set to any of the predetermined amount X to a maximum value, furthermore, the valve 21 is moved in the moving area B2 by the operation of the solenoid coil 3. For example, the valve 21 is moved to one of ends in the moving area B2 (a left end in FIG. 2) (a boundary position with the moving area B2) so that the flow rate of the exhaust gas is the predetermined amount X. When the valve 21 is moved to the other end in the moving area B2 (a right end in FIG. 2), moreover, the flow rate of the exhaust gas has the maximum value.

When the valve 21 is to be moved in the moving area A2, the microcomputer 10X transmits, to the micrometer 41, the signal Ax to be a moving instruction in the moving area A2. When the valve 21 is to be moved in the moving area B2, moreover, the microcomputer 10X transmits, to the solenoid coil 3, the signal Bx to be a moving instruction in the moving area B2.

When the signal Ax is to be transmitted to the motor M (the micrometer 41), furthermore, the microcomputer 10X transmits, to the switching mechanism 2, an instruction for inserting the pin portion P into the insertion hole H of the shaft portion 14. When the signal Bx is to be transmitted to the solenoid coil 3, moreover, the microcomputer 10X transmits, to the switching mechanism 2, an instruction for pulling the pin portion P out of the insertion hole H of the shaft portion 14.

In the pressure control device 1X, thus, areas to which the switching mechanism 2 and the valve 21 are to be moved by the micrometer 41 are set to be the moving areas A1 and A2, respectively. In the pressure control device 1X, moreover, areas to which the switching mechanism 2 and the valve 21 are to be moved by the solenoid coil 3 are set to be the moving areas B1 and B2, respectively.

Consequently, the valve 21 is moved to a position corresponding to the instruction sent from the microcomputer 10X. The exhaust gas in the pipe 6P flows to the pipe 6Q through the clearance between the pipe 6P and the pipe 6Q which are provided corresponding to the positions of the valve 21 (the moving areas A2 and B2).

Figure 3A:
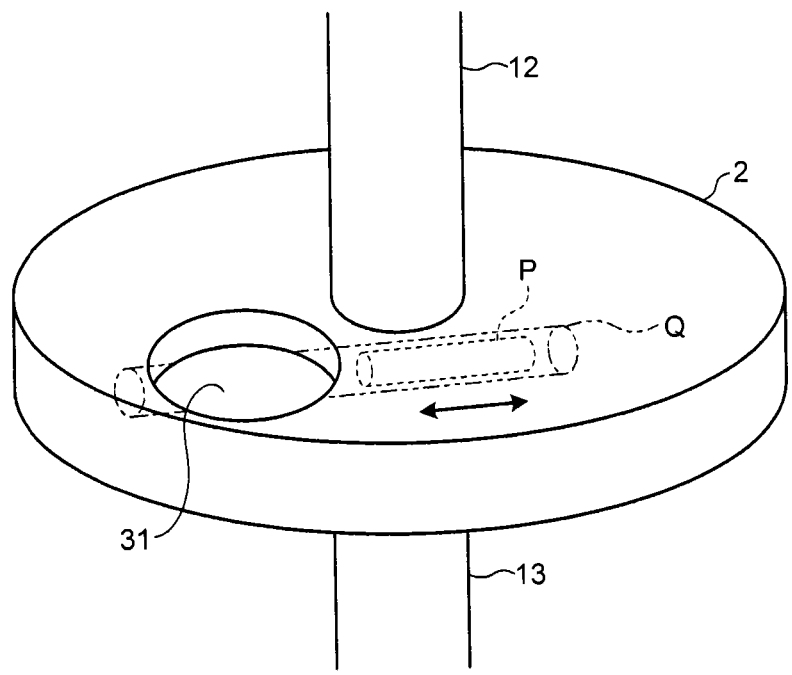
FIGS. 3A and 3B are views showing structures of a switching mechanism and a pin portion.
Figure 3B:
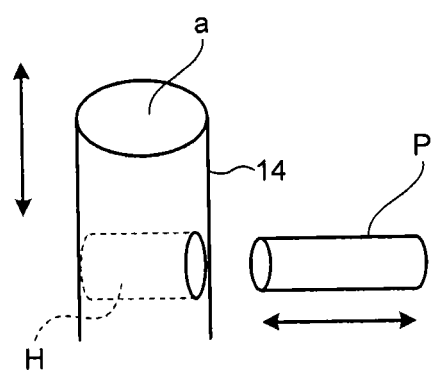

FIGS. 3A and 3B are views showing structures of the switching mechanism and the pin portion. As shown in FIG. 3A, the switching mechanism 2 is provided with the through hole 31 for causing the shaft portion 14 to penetrate therethrough. Moreover, the switching mechanism 2 has one of main surfaces to which the shaft portion 12 is connected and the other main surface to which the shaft portion 13 is connected. In addition, a storing portion Q for storing the pin portion P is provided in the switching mechanism 2. The storing portion Q has a cylindrical wall surface for storing the pin portion P in a state in which the pin portion P can be moved in an axial direction thereof (a perpendicular direction to the shaft portion 14), for example. The cylindrical wall surface of the storing portion Q is constituted to be larger than the pin portion P and to be longer than a diameter of the through hole 31 by a double or more.

By storing the pin portion P in the storing portion Q, the pin portion P can be moved together with the shaft portion 12 in the axial direction of the shaft portion 12. Furthermore, the pin portion P can be moved in a perpendicular direction to the shaft portion 14.

As shown in FIG. 3B, the shaft portion 14 has the insertion hole H for inserting the pin portion P therein in the vicinity of a tip part "a" (an end at an opposite side to the micrometer 41). The insertion hole H forms a cylindrical wall surface, for example, and is provided in an orthogonal direction to the axial direction of the shaft portion 14.

When the valve 21 is to be moved by the micrometer 41, the insertion hole H of the shaft portion 14 is also inserted into the through hole 31. The shaft portion 14 has a rotating direction thereof regulated in such a manner that a column shaft direction of the storing portion Q and that of the insertion hole H are identical to each other. When the tip part "a" of the shaft portion 14 is inserted into the through hole 31 so that the column shaft of the storing portion Q and that of the insertion hole H become identical to each other, the pin portion P is inserted into the insertion hole H so that the shaft portion 14 is fixed to the switching mechanism 2.

In the present embodiment, the position of the insertion hole H, the length of the shaft portion 14 and the like are regulated in such a manner that the position of the valve 21 can be adjusted by the micrometer 41 when the valve 21 is to be moved in the moving area A2, and furthermore, the position of the valve 21 can be adjusted by the solenoid coil 3 when the valve 21 is to be moved in the moving area B2. More specifically, the shaft portion 14 is connected to the shaft portion 12 through the pin portion P and the plate-shaped member of the switching mechanism 2. Therefore, the shaft portion 12 carries out the same movement as the shaft portion 14 when the shaft portion 14 is moved in the axial direction.

Next, the moving operation of the switching mechanism 2 will be described. First of all, explanation will be given to the case in which the flow rate of the exhaust gas from the pipe 6P to the pipe 6Q is varied to a maximum value (APC (Air Pressure Control) opening of 100%) to 0 (APC opening of 0%).

In the case in which the flow rate of the exhaust gas has the maximum value, the switching mechanism 2 is positioned on the right end of the moving area B1. At this time, the shaft portion 14 is maintained to be inserted into a deep part of the through hole 31. The insertion hole H is positioned on a left side of the pin portion P and the pin portion P is not inserted into the insertion hole H.

In the case in which the flow rate of the exhaust gas is to be decreased in this state, the signal Bx (an instruction for a movement toward a left side) is transmitted from the microcomputer 10X to the solenoid coil 3. Consequently, the solenoid coil 3 moves the switching mechanism 2 from an inner part of the moving area B1 in a direction of the moving area A1. In order to decrease the flow rate of the exhaust gas down to the predetermined amount X, furthermore, the switching mechanism 2 is moved to a boundary between the moving area B1 and the moving area A1.

At this time, the microcomputer 10X stops the transmission of the signal Bx to the solenoid coil 3, and furthermore, sends, to the switching mechanism 2, an instruction for inserting the pin portion P into the insertion hole H. Consequently, the pin portion P is inserted into the insertion hole H. Then, the microcomputer 10X transmits the signal Ax (an instruction for a movement toward the left side) to the motor M. Consequently, the micrometer 41 moves the switching mechanism 2 from the right end toward the left end in the moving area A1. In order to decrease the flow rate of the exhaust gas down to 0, furthermore, the switching mechanism 2 is moved to the left end of the moving area A1.

Next, description will be given to the case in which the flow rate of the exhaust gas from the pipe 6P to the pipe 6Q is varied from 0 to the maximum value. In the case in which the flow rate of the exhaust gas is 0, the switching mechanism 2 is positioned on the left end of the moving area A1. At this time, the shaft portion 14 is set to the insertion state into the through hole 31, and the pin portion P is inserted into the insertion hole H.

In the case in which the flow rate of the exhaust gas is to be increased in this state, the signal Ax (an instruction for a movement toward a right side) is transmitted from the microcomputer 10X to the motor M. Consequently, the micrometer 41 moves the switching mechanism 2 from an inner part of the moving area A1 in a direction of the moving area B1. In order to increase the flow rate of the exhaust gas up to the predetermined amount X, furthermore, the switching mechanism 2 is moved to a boundary between the moving area A1 and the moving area B1.

At this time, the microcomputer 10X stops the transmission of the signal Ax to the micrometer 41, and furthermore, sends, to the switching mechanism 2, an instruction for pulling the pin portion P out of the insertion hole H. Consequently, the pin portion P is pulled out of the insertion hole H. Then, the microcomputer 10X transmits the signal Bx (an instruction for a movement toward the right side) to the solenoid coil 3. Consequently, the solenoid coil 3 moves the switching mechanism 2 from the left end toward the right end in the moving area B1. In order to increase the flow rate of the exhaust gas up to the maximum value, furthermore, the switching mechanism 2 is moved to the right end of the moving area B1.

Thus, the switching mechanism 2 inserts/pulls the pin portion P into/out of the insertion hole H in the boundary position of the moving areas A1 and B1. More specifically, the pin portion P is pulled out of the insertion hole H in the case in which the switching mechanism 2 is moved from the moving area A1 to the moving area B1, and the pin portion P is inserted into the insertion hole H in the case in which the switching mechanism 2 is moved from the moving area B1 to the moving area A1.

Figure 4:
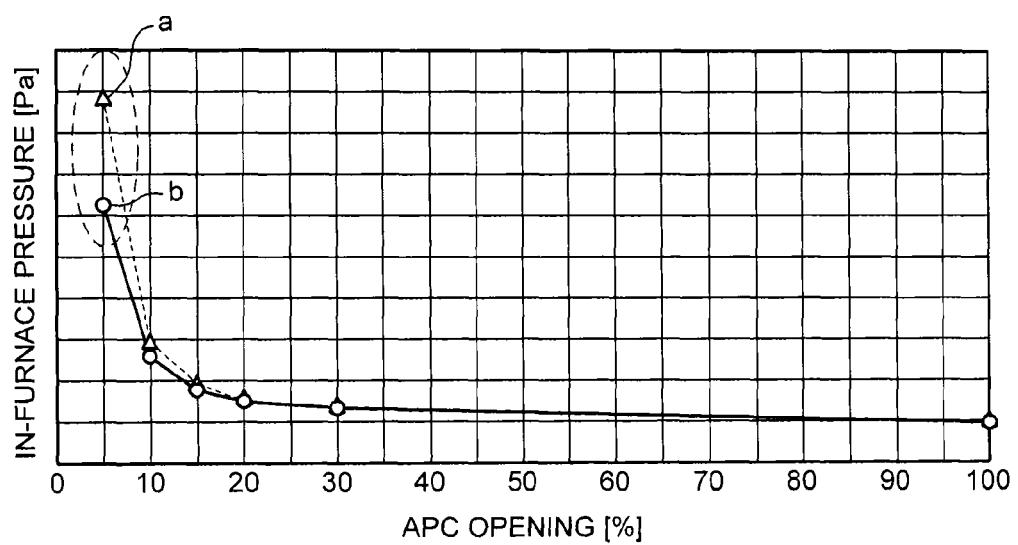
FIG. 4 is a chart showing a pressure control characteristic using a solenoid valve.

For example, in pressure control using only a solenoid valve, a variation in the pressure control is caused for each semiconductor manufacturing apparatus in some cases. FIG. 4 is a chart showing a pressure control characteristic using the solenoid valve. In FIG. 4, an axis of abscissa indicates an APC opening (a gate opening) and an axis of ordinate indicates an in-furnace pressure (a pressure in a chamber). In the case in which a pressure in the chamber is controlled by using only the solenoid valve, a pressure characteristic "a" of a first semiconductor manufacturing apparatus and a pressure characteristic "b" of a second semiconductor manufacturing apparatus represent different characteristics from each other when the APC opening (gate opening) is low.

In the present embodiment, in the case in which the APC opening is equal to or lower than a predetermined value, the pressure is controlled by the micrometer 41. Therefore, it is possible to precisely control the pressure. In the case in which the APC opening is higher than the predetermined value, moreover, the pressure is controlled by the solenoid coil 3. Therefore, it is possible to control the pressure at a high speed.

Although the description has been given to the case in which the switching mechanism 2 takes a shape of a disc in the present embodiment, the shape of the switching mechanism 2 is not restricted to the shape of the disc but any shape may be used. Moreover, it is also possible to employ a cylindrical hole wall surface having a bottom surface in place of the insertion hole H.

Although the shaft portions 11 to 13 are disposed coaxially in the present embodiment, moreover, the shaft portions 11 and 12 and the shaft portion 13 may be disposed on different axes. Also in this case, the shaft portion 14 is set in such a manner that the axial direction of the shaft portion 13 is parallel with that of the shaft portions 11 and 12.

Moreover, the Baratron sensor S may be disposed in the pipe 6Q. In this case, the Baratron sensor S measures a gas pressure in the pipe 6Q and the pressure control device 1X controls a pressure in the pipe 6Q.

In the semiconductor manufacturing apparatus 101, furthermore, the pressure control device 1X may be disposed on a pipe at a process gas introducing side. Moreover, the pin portion P is not restricted to be disposed in the switching mechanism 2 but may be disposed in any position.

According to the first embodiment, thus, the pressure in the pipe 6P is controlled by the micrometer 41 when the APC openings of the pipes 6P and 6Q are equal to or lower than the predetermine value (when the gas pressure in the pipe 6P is lower than the predetermined value), and the pressure in the pipe 6P is controlled by the solenoid coil 3 when the APC openings of the pipes 6P and 6Q are higher than the predetermined value (when the gas pressure in the pipe 6P is higher than the predetermined value). Therefore, it is possible to precisely control the pressure at a high speed.

Second Embodiment

Next, a second embodiment according to the present invention will be described with reference to FIG. 5. In the second embodiment, a pressure is controlled without using a pin portion P but a solenoid coil 3 and a micrometer 41.

Figure 5:
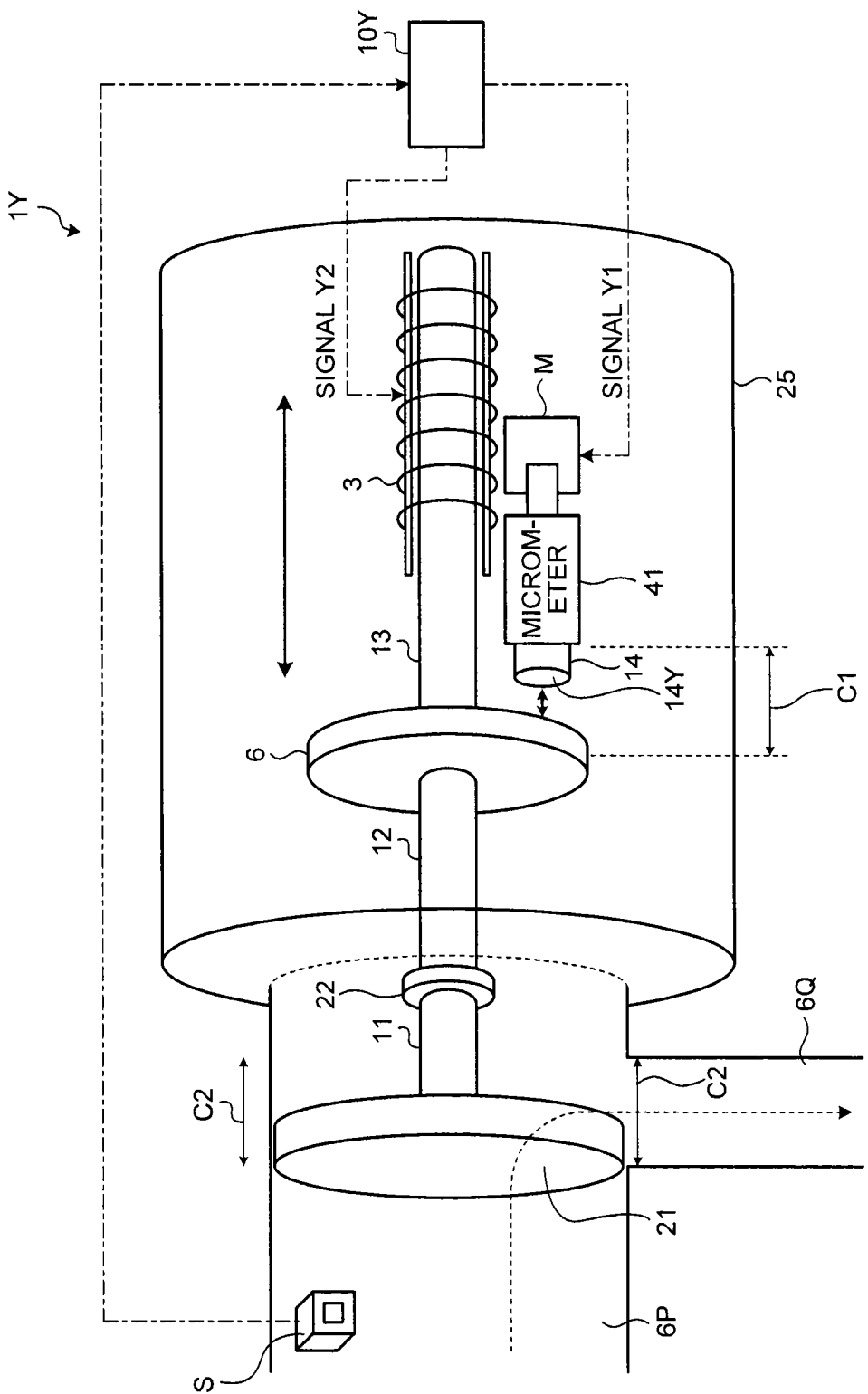
FIG. 5 is a view showing a structure of a pressure control device according to a second embodiment.

FIG. 5 is a view showing a structure of a pressure control device according to the second embodiment. Components in FIG. 5 which achieve the same function as the pressure control device 1X according to the first embodiment shown in FIG. 2 have the same numbers and repetitive description will be omitted.

A pressure control device 1Y has a moving range limiting portion 6 in place of the switching mechanism 2 and has a microcomputer 10Y in place of the microcomputer 10X as compared with the pressure control device 1X. More specifically, the pressure control device 1Y includes a housing 25, shaft portions 11 to 14, the solenoid coil 3, a valve 21, a vacuum shield 22, the moving range limiting portion 6, the microcomputer 10Y, the micrometer 41, and a motor M.

The moving range limiting portion 6 is formed by a plate-like member taking a shape of a disc, for example, and is bonded to the shaft portions 12 and 13 in such a manner that a main surface is perpendicular to an axial direction of the shaft portions 12 and 13. Moreover, the moving range limiting portion 6 is not bonded to the shaft portion 14. In addition, the microcomputer 10Y according to the present embodiment sends an instruction to the solenoid coil 3 and the motor M in such a manner that an inner part of a pipe 6P has a predetermined gas pressure based on a pressure value transmitted from Baratron sensor S.

The microcomputer 10Y according to the present embodiment transmits signals Y1 and Y2 to be moving instructions to the micrometer 41 and the solenoid coil 3 respectively when moving the valve 21 in a moving area C2.

The moving area C2 according to the present embodiment is an area obtained by adding the moving areas A2 and B2 described in the first embodiment. In other words, the moving area C2=the moving area (A2+B2) is set. Similarly, a moving area C1 to be a moving area of the moving range limiting portion 6 is obtained by adding the moving areas A1 and B1 described in the first embodiment. In other words, the moving area C1=a moving area (A1+B1) is set.

Position control of the valve 21 (the moving range limiting portion 6) through the solenoid coil 3 is rougher than that of the micrometer 41. For this reason, in the present embodiment, the moving range limiting portion 6 is moved by the solenoid coil 3 and a moving range of the moving range limiting portion 6 is limited by the micrometer 41 in order to move the valve 21 to a desirable position.

More specifically, the micrometer 41 previously moves a tip part 14Y to a predetermined collision position in such a manner that a main surface on the shaft portion 13 side of the moving range limiting portion 6 and the tip part 14Y of the shaft portion 14 (an end on an opposite side to the micrometer 41) collide with each other in a moving destination of the moving range limiting portion 6 (a predetermined moving position). Consequently, a movement of the moving range limiting portion 6 in a rightward direction from the tip part 14Y is interrupted by the tip part 14Y. Accordingly, a movable range of the moving range limiting portion 6 is set from a left end in the moving area C1 to a position of the tip part 14Y so that a range of an APC opening is limited.

Next, a moving operation of the moving range limiting portion 6 will be described. In the case in which it is necessary to move the moving range limiting portion 6 from the tip part 14Y to a left side predetermined position p1, the microcomputer 10Y transmits, to the solenoid coil 3, the signal Y2 for moving the moving range limiting portion 6 to the left side predetermined position p1 (not shown). Moreover, the microcomputer 10Y transmits, to the motor M, the signal Y1 for moving the moving range limiting portion 6 to the left side predetermined position p1. Consequently, the tip part 14Y is moved to the left side predetermined position p1.

The moving range limiting portion 6 carries out position control for the left side predetermined position p1 through the solenoid coil 3 in a position on a left side of the tip part 14Y. Any of the transmission of the signal Y1 to the motor M and that of the signal Y2 to the solenoid coil 3 may be carried out earlier or both of them may be carried out at the same time.

In the case in which it is necessary to move the moving range limiting portion 6 to a right side predetermined position p2 (not shown) from the tip part 14Y, moreover, the microcomputer 10Y transmits, to the motor M, the signal Y1 for moving the moving range limiting portion 6 to the right side predetermined position p2. When the movement of the moving range limiting portion 6 through the micrometer 41 is completed, then, the microcomputer 10Y transmits, to the solenoid coil 3, the signal Y2 for moving the moving range limiting portion 6 to the right side predetermined position p2.

Consequently, the moving range limiting portion 6 carries out the position control for the right side predetermined position p2 through the solenoid coil 3 in a position on the left side of the tip part 14Y. Any of the transmission of the signal Y1 to the motor M and that of the signal Y2 to the solenoid coil 3 may be carried out earlier or both of them may be carried out at the same time. In the case in which the transmission of the signal Y2 is carried out earlier, the operation of the micrometer 41 is transmitted to the moving range limiting portion 6 so that the gate opening of the valve 21 is regulated precisely.

In the present embodiment, thus, it is preferable to control the movement of the moving range limiting portion 6 within a small range on the left side of the tip part 14Y. As compared with the case in which the movement of the moving range limiting portion 6 is controlled over the whole moving area C1, therefore, it is possible to carry out position control more accurately.

In the case in which the moving range limiting portion 6 (the valve 21) is moved by using the solenoid coil 3, the moving range limiting portion 6 has a great amplitude for positioning (a variation in the axial direction). For this reason, in the case in which the moving range limiting portion 6 is moved in the moving area C1 by using only the solenoid coil 3, precision in the position of the moving range limiting portion 6 is deteriorated due to the great amplitude. On the other hand, in the present embodiment, the moving range limiting portion 6 is moved within a small range on the left side of the tip part 14Y. Therefore, the amplitude is reduced. As a result, it is possible to enhance precision in the position of the moving range limiting portion 6. Accordingly, it is possible to control the valve 21 with high precision. As a result, it is possible to precisely control a gas pressure in the pipe 6P. The micrometer 41 may be operated to move the tip part 14Y to an outside of a working range of the moving range limiting portion 6.

When a semiconductor device (a semiconductor integrated circuit) is to be manufactured, a wafer processing is carried out by various semiconductor manufacturing apparatuses. More specifically, a film is formed on a wafer W by a film forming apparatus (the semiconductor manufacturing apparatus 101 or the like), and the wafer is coated with a resist by a resist coating apparatus. Then, an exposing apparatus uses a mask to carry out an exposure over the wafer. Then, a developing apparatus develops the wafer to form a resist pattern on the wafer. Thereafter, an etching apparatus carries out etching over a lower layer side of the wafer W by using the resist pattern as a mask. Consequently, an actual pattern corresponding to the resist pattern is formed on the wafer W. When the semiconductor device is to be manufactured, a film formation processing, a resist coating processing, an exposure processing, a development processing, an etching processing and the like are repeated every layer.

A shape of the shaft portion 14 is not restricted to a bar but other shapes may be taken. For example, the shaft portion 14 may take a cylindrical shape which surrounds the shaft portion 13.

According to the second embodiment, thus, the moving range of the moving range limiting portion 6 is limited by the tip part 14Y, and furthermore, the valve 21 is controlled by the solenoid coil 3. Therefore, it is possible to precisely move the valve 21 at a high speed with a simple structure.

Third Embodiment

Figure 6:
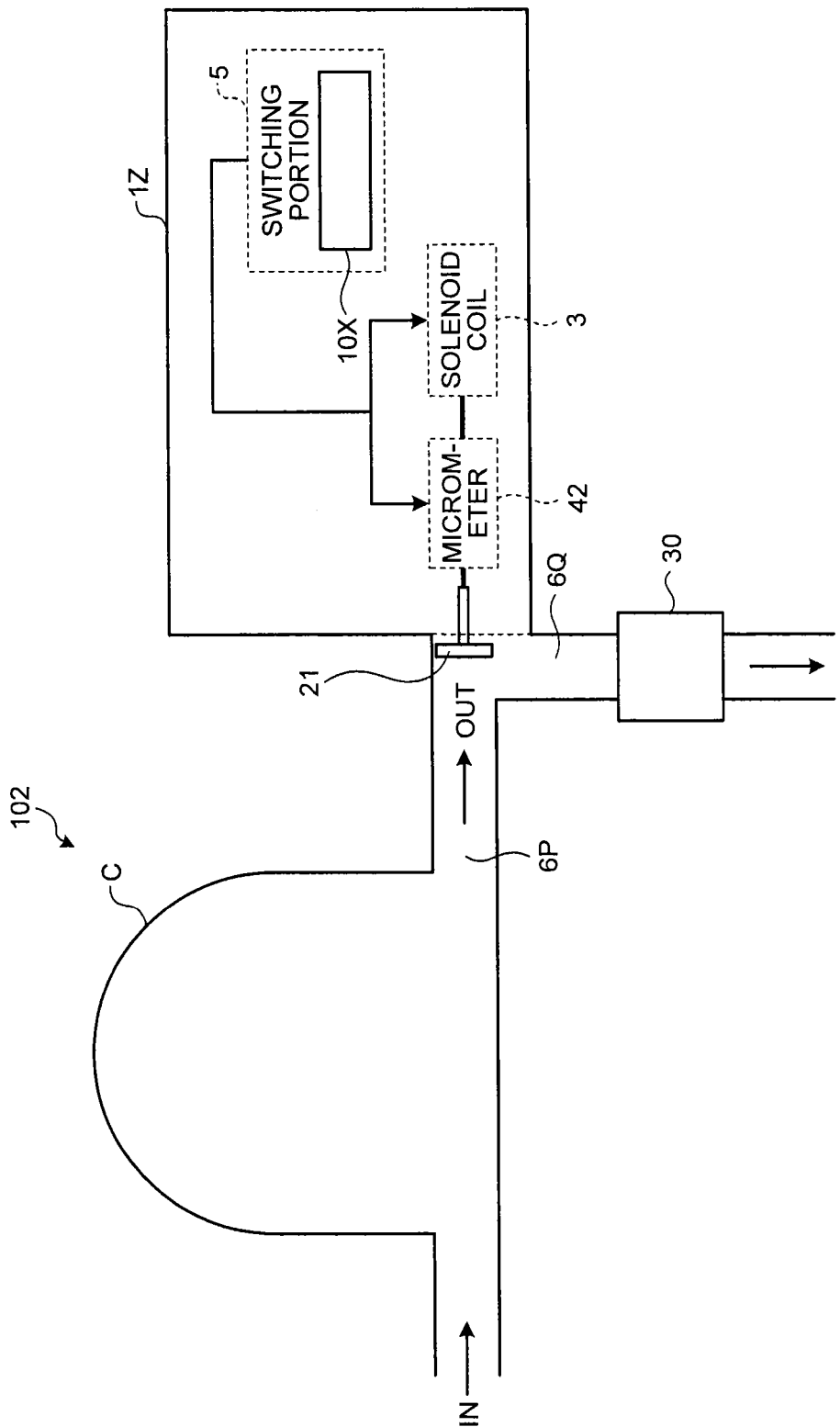
FIG. 6 is a diagram showing a structure of a semiconductor manufacturing apparatus including a pressure control device according to a third embodiment.

FIG. 6 is a diagram showing a structure of a semiconductor manufacturing apparatus including a pressure control device according to a third embodiment. A semiconductor manufacturing apparatus 102 includes a process chamber C, a pipe (an upstream side gas pipe) 6P, a pressure control device 1Z, a pipe (a downstream side gas pipe) 6Q, and a discharge pump 30. The pressure control device 1Z according to the present embodiment switches, in a desirable timing, gas pressure control in the pipe through a micrometer 42 and gas pressure control in the pipes 6P and 6Q through a solenoid coil 3. The pressure control device 1Z controls the gas pressures in the pipes 6P and 6Q by the micrometer 42 when the gas pressures in the pipes 6P and 6Q are equal to or lower than a predetermined value, and controls the gas pressures in the pipes 6P and 6Q by the solenoid coil 3 when the gas pressures in the pipes 6P and 6Q are higher than the predetermined value, for example.

The process chamber C is a processing chamber for forming a thin film on a substrate (a wafer) on which a semiconductor device (a semiconductor integrated circuit) is to be formed with respect to the wafer. A process gas is introduced in a vacuum state into the process chamber C so that the thin film is formed on the wafer. A gas is discharged in a predetermined amount as an exhaust gas from the process chamber C. The exhaust gas discharged from the process chamber C is fed to the discharge pump 30 through the pipes 6P and 6Q and is fed to an outside (an exhaust gas processing device) or the like through the discharge pump 30.

In the semiconductor manufacturing apparatus 102, a pressure control device 1Z is provided between the pipe 6P and the pipe 6Q, and the gas pressure in the pipe 6P is controlled by the pressure control device 1Z. The gas pressure in the pipe 6P is controlled so that the process gas pressure in the process chamber C is controlled.

The pressure control device 1Z according to the present embodiment has a valve 21, the solenoid coil 3, the micrometer 42, and a switching portion 5. The solenoid coil 3 moves the valve 21 in the pipes 6P and 6Q in an axial direction through solenoid driving, thereby regulating a flow rate of the exhaust gas from the pipe 6P to the pipe 6Q. The micrometer 42 moves the valve 21 in the axial direction by means of a screw mechanism, thereby regulating an amount of discharge of the gas from the pipe 6P to the pipe 6Q.

The switching portion 5 is connected to the solenoid coil 3 and the micrometer 42. The switching portion 5 includes a microcomputer 10X for controlling an operation of the valve 21. The microcomputer 10X sends an operation instruction (ON/OFF switching) to each of the solenoid coil 3 and the micrometer 42, thereby controlling the operations of the solenoid coil 3 and the micrometer 42.

The microcomputer 10X according to the present embodiment switches opening/closing control of the valve 21 through the solenoid coil 3 and opening/closing control of the valve 21 through the micrometer 42. The microcomputer 10X operates the valve 21 by the micrometer 42 when an exhaust gas is to be discharged in a small amount from the pipe 6P to the pipe 6Q, and operates the valve 21 by the solenoid coil 3 when the exhaust gas is to be discharged in a large amount from the pipe 6P to the pipe 6Q, for example. Consequently, precise exhaust gas pressure control can be carried out by the micrometer 42 when the exhaust gas is to be discharged in a small amount, and high-speed exhaust gas pressure control can be carried out by the solenoid coil 3 when the exhaust gas is to be discharged in a large amount.

Figure 7:
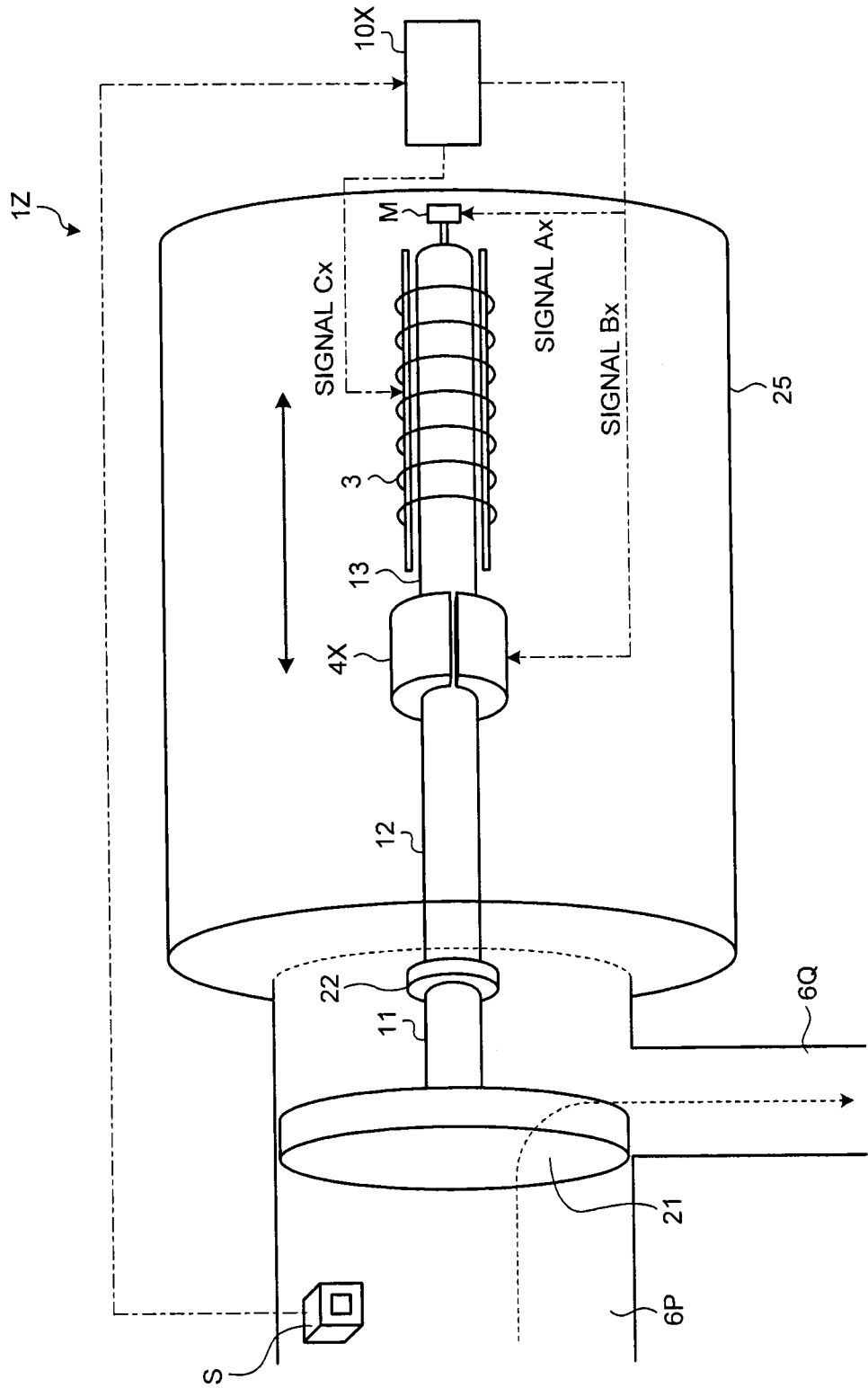
FIG. 7 is a view showing a structure of the pressure control device according to the third embodiment.

Next, description will be given to a structure of the pressure control device 1Z. FIG. 7 is a view showing a structure of the pressure control device according to the third embodiment. The pressure control device 1Z is disposed between the pipe 6P and the pipe 6Q and controls the flow rate of the exhaust gas from the pipe 6P to the pipe 6Q.

The pressure control device 1Z includes a housing 25, shaft portions 11, 12 and 13, the solenoid coil 3, the valve 21, a vacuum shield 22, the microcomputer 10X, a guide portion 4X, and a motor M. The micrometer 42 is constituted by the shaft portions 11 to 13, the guide portion 4X and the motor M.

The shaft portions 11, 12 and 13 are formed integrally by a bar-shaped member so as to be arranged coaxially, and the valve 21 is disposed on one of tip parts (a left end of the shaft portion 11 in FIG. 7). The shaft portions 11 to 13 are moved in an axial direction of the shaft portions 11 to 13 (a transverse direction in the drawing) to move the valve 21 in the axial direction of the shaft portion 11.

The valve 21 is moved in the axial direction of the shaft portions 11 to 13 in the pipes 6P and 6Q to regulate an amount of a clearance between the pipe 6P and the pipe 6Q. For example, the valve 21 is moved to a left side in the drawing so that the clearance (a gate opening) between the pipe 6P and the pipe 6Q is reduced. Consequently, the flow rate of the exhaust gas flowing from the pipe 6P to the pipe 6Q is decreased. As a result, a pressure in the process chamber C is raised. Moreover, the valve 21 is moved to a right side in the drawing so that the clearance between the pipe 6P and the pipe 6Q is increased. Consequently, the flow rate of the exhaust gas flowing from the pipe 6P to the pipe 6Q is increased. As a result, the pressure in the process chamber C is decreased.

Baratron sensor S is provided in the pipe 6P. The Baratron sensor S measures the gas pressure in the pipe 6P. The Baratron sensor S sends a result of the measurement of the gas pressure to the microcomputer 10X.

The vacuum shield 22 is disposed in a bonding position in which the pipes 6P and 6Q and the housing 25 are bonded to each other. The vacuum shield 22 has a through hole for causing the shaft portions 11 and 12 to penetrate therethrough, and the shaft portions 11 and 12 are inserted into the through hole so as to freely penetrate therethrough (so as to be freely inserted therein). The vacuum shield 22 is constituted to enable the movement of the shaft portions 11 and 12 in the axial direction while maintaining airtight in such a manner that the flow-out/in of a gas between the pipes 6P and 6Q and the housing 25 is not caused. In the present embodiment, for convenience of explanation, description will be given on the assumption that the shaft portion between the vacuum shield 22 and the valve 21 is set to be the shaft portion 11, the shaft portion between the vacuum shield 22 and the guide portion 4X is set to be the shaft portion 12, and the shaft portion on the solenoid coil 3 side from the guide portion 4X is set to be the shaft portion 13. Accordingly, the guide portion 4X is disposed between the shaft portions 12 and 13 and the solenoid coil 3 is wound upon a right end side of the shaft portion 13.

The solenoid coil 3 moves the shaft portions 11 to 13 in the axial direction through solenoid driving. The solenoid coil 3 moves the shaft portion 13 in the axial direction in accordance with an instruction (a signal Cx) sent from the microcomputer 10X. The solenoid coil 3 moves the shaft portion 13 to a position corresponding to the signal Cx.

The motor M axially rotates the shaft portion 13 by using a rotating power in accordance with an instruction (a signal Ax) sent from the microcomputer 10X. The motor M is connected to an end side of the shaft portion 13 (an opposite side to the shaft portion 12) (a right end side in FIG. 7), for example, and rotates the shaft portion 13 from the end side. The guide portion 4X moves the shaft portion 13 to a position corresponding to the signal Ax sent from the microcomputer 10X to the motor M.

The guide portion 4X according to the present embodiment has an opening/closing mechanism constituted by two semicylindrical members. The two semicylindrical members are disposed in such a manner that inner wall surfaces thereof surround outer peripheral parts of the shaft portions 12 and 13, and are opened/closed in response to a signal Bx sent from the microcomputer 10X to the guide portion 4X. The guide portion 4X is brought into a closing state by causing the semicylindrical members to approach the shaft portions 12 and 13 and is brought into an opening state by causing the semicylindrical members to go away from the shaft portions 12 and 13.

When the shaft portion 13 is to be moved by using the guide portion 4X, the semicylindrical members are brought into the closing state. When the shaft portion 13 is to be moved by using the solenoid coil 3, the semicylindrical members are brought into the opening state.

A thread groove of a male screw is provided on the outer wall surfaces of the shaft portions 12 and 13 and a thread groove of a female screw is provided on the inner wall surfaces of the semicylindrical members. In other words, the shaft portions 12 and 13 function as bolts and the semicylindrical members function as nuts. In the case in which the semicylindrical members are brought into the closing state, the thread grooves of the semicylindrical members are fitted in the thread grooves of the shaft portions 12 and 13. The shaft portions 12 and 13 are rotated along the thread grooves by a rotation of the motor M and are moved in the axial direction by the rotation along the thread grooves.

The microcomputer 10X sends an instruction to the solenoid coil 3, the motor M and the guide portion 4X in such a manner that an inner part of the pipe 6P has a desirable gas pressure based on a pressure value (a gas pressure) transmitted from the Baratron sensor S. More specifically, the microcomputer 10X transmits an instruction for moving the shaft portion 13 (the signal Cx) to the solenoid coil 3. Moreover, the microcomputer 10X transmits an instruction for moving the shaft portion 13 (the signal Ax) to the motor M and transmits an instruction for opening/closing the guide portion 4X (the signal Bx).

When transmitting, to the motor M, the instruction for moving the shaft portion 13, the microcomputer 10X sends, to the guide portion 4X, an instruction for bringing the semicylindrical members into the closing state. When transmitting, to the motor M, an instruction for stopping the shaft portion 13, moreover, the microcomputer 10X sends, to the guide portion 4X, an instruction for bringing the semicylindrical members into the opening state.

When transmitting, to the solenoid coil 3, the instruction for moving the shaft portion 13, furthermore, the microcomputer 10X sends, to the motor M, the instruction for stopping the shaft portion 13 and sends, to the guide portion 4X, the instruction for bringing the semicylindrical members into the opening state.

The housing 25 takes an almost cylindrical shape and stores the shaft portions 12 and 13, the solenoid coil 3, the vacuum shield 22, the guide portion 4X, and the motor M. The housing 25 is connected to the pipes 6P and 6Q through the vacuum shield 22.

In the pressure control device 1Z, either of the operations of the guide portion 4X and the solenoid coil 3 is transmitted to the shaft portion 12 so that the shaft portion 12 is moved in the axial direction. Consequently, the shaft portion 11 is moved in the axial direction so that the valve 21 is moved in the axial direction of the shaft portion 11.

Thus, the valve 21 is moved to a position corresponding to the instruction sent from the microcomputer 10X. Then, the exhaust gas in the pipe 6P flows to the pipe 6Q from a clearance between the pipes 6P and 6Q provided depending on the position of the valve 21.

In the present embodiment, pressure control through the guide portion 4X and pressure control through the solenoid coil 3 are switched in a desirable position in a desirable timing. For example, the microcomputer 10X causes the guide portion 4X to carry out precise pressure control when performing the pressure control, and causes the solenoid coil 3 to carry out high-speed pressure control when performing the pressure control. More specifically, in the case in which APC (Air Pressure Control) openings of the pipes 6P and 6Q are equal to or lower than a predetermined value (the gas pressure in the pipe 6P is equal to or lower than the predetermined value), the pressure in the pipe 6P is controlled by the guide portion 4X. In the case in which the APC openings of the pipes 6P and 6Q are higher than the predetermined value (the gas pressure in the pipe 6P is higher than the predetermined value), moreover, the pressure in the pipe 6P is controlled by the solenoid coil 3.

Figure 8:
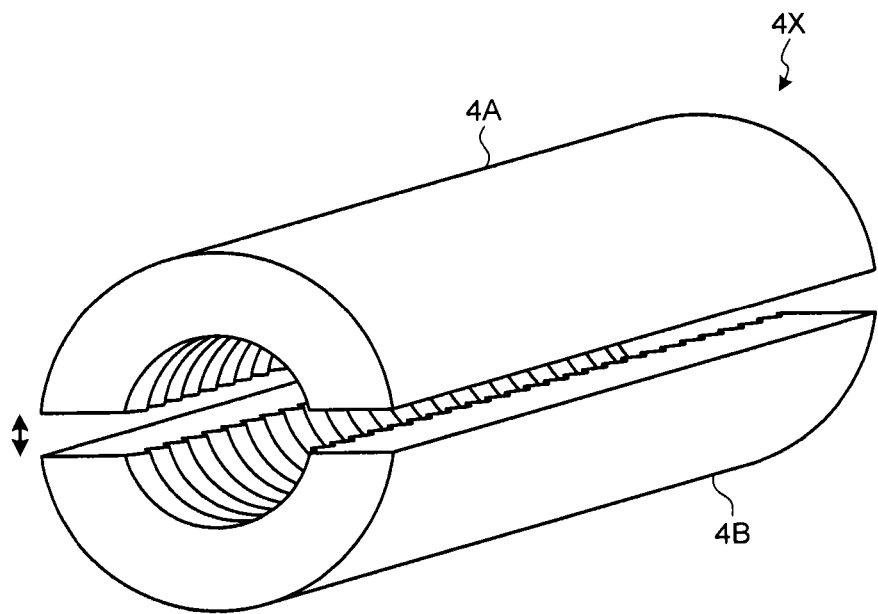
FIG. 8 is a view showing an example of a structure of a micrometer according to the third embodiment.

Next, description will be given to a structure of the guide portion 4X. FIG. 8 is a view showing an example of the structure of the guide portion according to the third embodiment. The guide portion 4X is constituted to include semicylindrical members 4A and 4B. In FIG. 8, a semicylindrical member illustrated on an upper side represents the semicylindrical member 4A and a semicylindrical member illustrated on a lower side represents a semicylindrical member 4B. The semicylindrical members 4A and 4B take shapes obtained by cutting cylindrical members through a plane including a central axis.

The semicylindrical members 4A and 4B are constituted to be movable in such a direction as to approach each other in a direction of the central axis or to go away from each other in the direction of the central axis. In other words, the semicylindrical members 4A and 4B are attached to the shaft portions 12 and 13 removably. When the semicylindrical members 4A and 4B approach each other in the direction of the central axis and thus abut on each other, they take a cylindrical shape. At this time, the semicylindrical members 4A and 4B interpose the shaft portions 12 and 13 through their own inner wall surfaces.

Threads are provided on the inner wall surfaces of the semicylindrical members 4A and 4B and are fitted in screw grooves provided on the shaft portions 12 and 13. In the case in which a shift is caused in the fitting of the threads of the semicylindrical members 4A and 4B and the screw grooves of the shaft portions 12 and 13, the motor M may rotate the shaft portion 13 to adjust a fitting position.

In the present embodiment, in the case in which the shaft portions 12 and 13 are moved by using the guide portion 4X, the semicylindrical members 4A and 4B are caused to approach each other in the direction of the central axis. Consequently, the threads of the semicylindrical members 4A and 4B are fitted in the screw grooves of the shaft portions 12 and 13. On the other hand, in the case in which the solenoid coil 3 is used to move the shaft portions 12 and 13, the semicylindrical members 4A and 4B are caused to go away from each other in the direction of the central axis. Consequently, the threads of the semicylindrical members 4A and 4B are removed from the screw grooves of the shaft portions 12 and 13.

In a state in which the semicylindrical members 4A and 4B are fitted in the shaft portions 12 and 13, the shaft portions 12 and 13 are moved in the axial direction while carrying out a rotation along the threads of the semicylindrical members 4A and 4B. On the other hand, in a state in which the semicylindrical members 4A and 4B are removed from the shaft portions 12 and 13, the shaft portions 12 and 13 are moved irrespective of the semicylindrical members 4A and 4B.

Figure 9A:
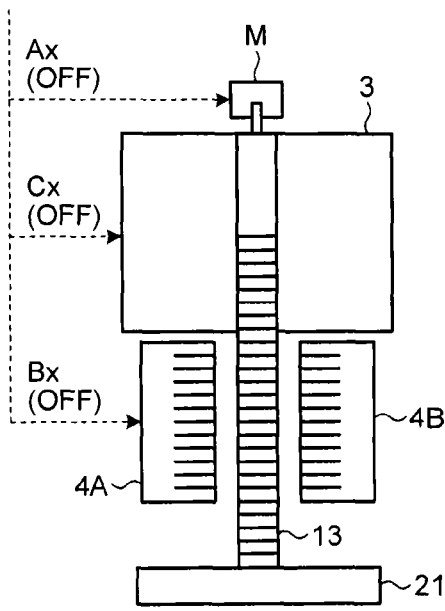
FIGS. 9A to 9C are views for explaining moving control of a shaft portion.
Figure 9B:
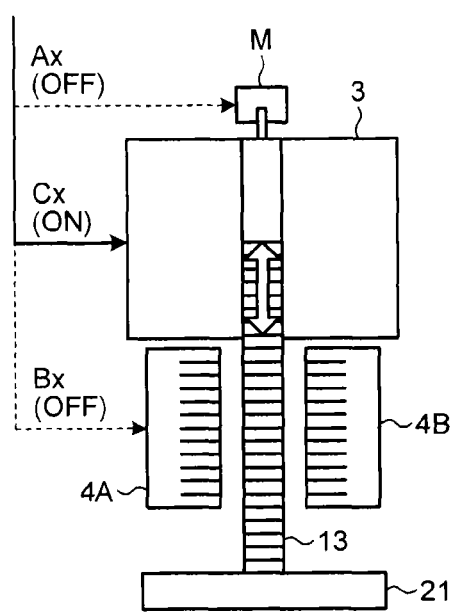
Figure 9C:
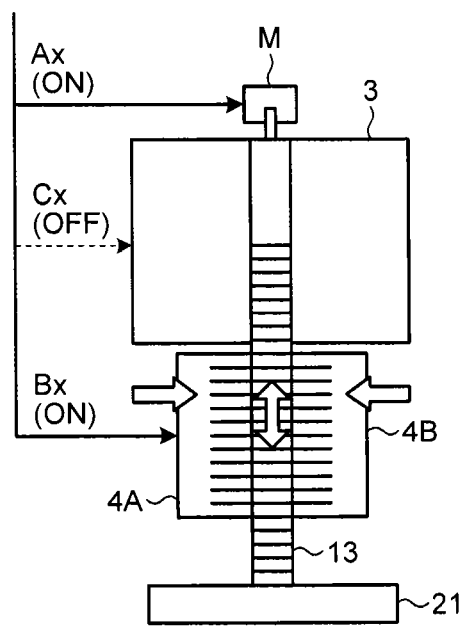

FIGS. 9A to 9C are views for explaining moving control of the shaft portion. FIG. 9A shows a state in which the shaft portion 13 is stopped. Moreover, FIG. 9B shows a state in which the shaft portion 13 is moved by the solenoid coil 3, and FIG. 9C shows a state in which the shaft portion 13 is moved by the guide portion 4X.

As shown in FIG. 9A, the signal Ax to be transmitted to the motor M, the signal Cx to be transmitted to the solenoid coil 3, and the signal Bx to be transmitted to the guide portion 4X are turned OFF respectively so that the shaft portion 13 is stopped. Consequently, the opening/closing operation of the valve 21 is also stopped.

As shown in FIG. 9B, the signal Ax to be transmitted to the motor M is turned OFF, the signal Bx to be transmitted to the guide portion 4X is turned OFF in a state in which the semicylindrical members 4A and 4B are opened, and the signal Cx to be transmitted to the solenoid coil 3 is turned ON so that the shaft portion 13 is moved by the solenoid coil 3. At this time, the signal Cx depending on a position to which the valve 21 is to be moved is transmitted to the solenoid coil 3. Consequently, the opening/closing operation of the valve 21 is controlled by the solenoid coil 3.

As shown in FIG. 9C, the signal Ax to be transmitted to the motor M and the signal Bx to be transmitted to the guide portion 4X are turned ON respectively and the signal Cx to be transmitted to the solenoid coil 3 is turned OFF so that the shaft portion 13 is moved by the guide portion 4X and the motor M. At this time, the signal Ax depending on the position to which the valve 21 is to be moved is transmitted to the guide portion 4X. Consequently, the opening/closing operation of the valve 21 is controlled by the guide portion 4X and the motor M.

In the present embodiment, thus, the opening/closing operation of the valve 21 through the guide portion 4X and the opening/closing operation of the valve 21 through the solenoid coil 3 are switched. In the semiconductor manufacturing apparatus 102, consequently, there is carried out pressure control using either of the guide portion 4X and the solenoid coil 3.

In the case in which the APC opening is equal to or lower than the predetermined value, the pressure can be controlled by the guide portion 4X. Therefore, precise pressure control can be carried out. In the case in which the APC opening is higher than the predetermined value, moreover, the pressure can be controlled by the solenoid coil 3. Therefore, high-speed pressure control can be carried out.

Although the description has been given to the case in which the Baratron sensor S is disposed in the pipe 6P in the present embodiment, the Baratron sensor S may be provided in the pipe 6Q. In this case, the Baratron sensor S measures the gas pressure in the pipe 6Q and the pressure control device 1Z controls the pressure in the pipe 6Q. In the semiconductor manufacturing apparatus 102, moreover, the pressure control device 1Z may be disposed on a pipe at a process gas introducing side. Furthermore, the solenoid coil 3 may be disposed on the valve 21 side from the guide portion 4X.

Although the description has been given to the case in which the motor M rotates the shaft portion 13 at an end side (an opposite side to the shaft portion 12) in the present embodiment, moreover, the shaft portion 13 may be rotated between the guide portion 4X and the solenoid coil 3 (a central part of the shaft portion 13). In addition, the motor M may rotate the shaft portion 12 in a central part of the shaft portion 12. Description will be given to the case in which the motor M rotates the shaft portion 12 or the shaft portion 13 in the central part.

Figure 10:
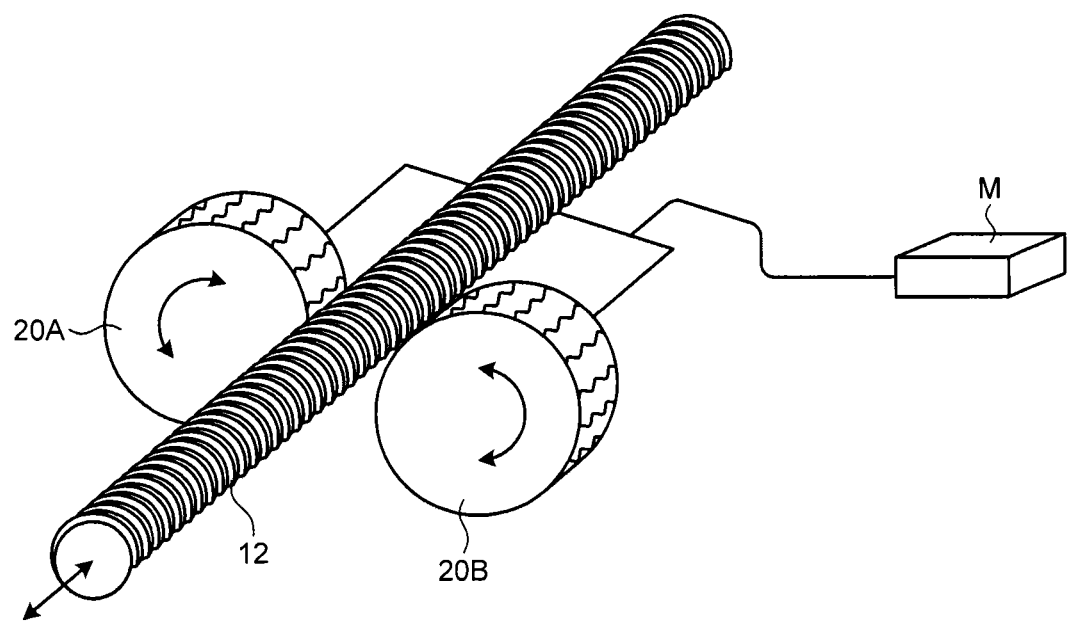
FIG. 10 is a view for explaining a rotating mechanism in the case in which the shaft portion is rotated in a central part of the shaft portion.

FIG. 10 is a view for explaining a rotating mechanism in the case in which the shaft portion is rotated in the central part of the shaft portion. FIG. 10 shows the rotating mechanism in the case in which the shaft portion 12 is rotated in a part (the central part) other than the end of the shaft portion 12. The rotating mechanism is constituted to include the motor M and rotating and driving portions 20A and 20B.

The rotating and driving portions 20A and 20B are almost cylinder-shaped (disc-shaped). The rotating and driving portions 20A and 20B are connected to the motor M and are rotated by setting a columnar shaft as a rotating axis by means of the motor M. The rotating and driving portions 20A and 20B are disposed in the vicinity of the shaft portion 12, and side surfaces of the rotating and driving portions 20A and 20B are caused to abut on the shaft portion 12 when the shaft portion 12 is to be rotated by using the motor M. On the other hand, in the case in which the shaft portion 12 is not rotated by using the motor M, the side surfaces of the rotating and driving portions 20A and 20B are kept away from the shaft portion 12.

A non-slip member is disposed on the side surfaces of the rotating and driving portions 20A and 20B, for example. Moreover, a groove for increasing a frictional force together with the shaft portion 12 is provided on the side surfaces of the rotating and driving portions 20A and 20B. By the structure, when the rotating and driving portions 20A and 20B are rotated in a state in which the side surfaces of the rotating and driving portions 20A and 20B abut on the shaft portion 12, the shaft portion 12 is rotated by the frictional force generated between the rotating and driving portions 20A and 20B and the shaft portion 12. Although the description has been given to the case in which the two rotating and driving portions 20A and 20B are provided, the number of the rotating and driving portions may be one, or three or more.

When a semiconductor device (a semiconductor integrated circuit) is to be manufactured, a wafer processing is carried out by various semiconductor manufacturing apparatuses. More specifically, a film forming apparatus (the semiconductor manufacturing apparatus 102 or the like) forms a film on a wafer, and a resist coating apparatus then coats the wafer with a resist. Thereafter, an exposing apparatus uses a mask to carry out an exposure over the wafer. Subsequently, a developing apparatus develops the wafer to form a resist pattern on the wafer. Next, an etching apparatus etches a lower layer side of the wafer by using the resist pattern as a mask. Consequently, an actual pattern corresponding to the resist pattern is formed on the wafer. When the semiconductor device is to be manufactured, the film formation processing, the resist coating processing, the exposure processing, the development processing, the etching processing and the like are repeated every layer.

According to the third embodiment, thus, the guide portion 4X is constituted by the semicylindrical members 4A and 4B which can be attached/removed to/from the shaft portions 12 and 13. Therefore, the pressure control through the guide portion 4X (the micrometer 42) and the pressure control through the solenoid coil 3 can be switched in a desirable timing. Accordingly, it is possible to carry out precise high-speed pressure control.

According to the first to third embodiments, thus, it is possible to control the gas pressure in the pipe precisely at a high speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pressure control device comprising:
   a valve configured to regulate a gate opening between an upstream side gas pipe and a downstream side gas pipe, thereby regulating a gas pressure in the upstream side gas pipe or the downstream side gas pipe;
   a shaft portion connected to the valve;

a solenoid portion configured to move the shaft portion in an axial direction through solenoid driving, thereby regulating the gate opening through the shaft portion;

a unit removably attached to the shaft portion, the unit being configured to move the shaft portion in the axial direction by a screw mechanism and a motor in order to regulate the gate opening through the shaft portion when the unit is attached to the shaft portion; and a control unit configured to control the solenoid portion and the unit in such a manner that the gas pressure in the upstream side gas pipe or the downstream side gas pipe is a desirable gas pressure, wherein the unit controls the gas pressure when the unit is attached to the shaft portion, and the solenoid portion controls the gas pressure when the unit is removed from the shaft portion.

2. The pressure control device according to claim 1, wherein the control unit regulates the gate opening through the unit when the gate opening is equal to or lower than a predetermined value, and regulates the gate opening through the solenoid portion when the gate opening is higher than the predetermined value.

3. The pressure control device according to claim 1, wherein the unit includes two semicylindrical members, and an outer wall surface of the shaft portion is fitted in an inner wall surface of the semicylindrical member when the unit is to be attached to the shaft portion.

4. The pressure control device according to claim 3, wherein an inner wall surface of the semicylindrical member is provided with a screw groove of a female screw, and an outer wall surface of the shaft portion is provided with a screw groove of a male screw.

5. The pressure control device according to claim 1, wherein the motor is configured to axially rotate the shaft portion at an end of the shaft portion on an opposite side to the valve.

6. The pressure control device according to claim 1, wherein the motor is configured to axially rotate the shaft portion in a position of the shaft portion between the valve and the solenoid portion.

7. The pressure control device according to claim 1, wherein the unit has a rotating and driving portion which takes an almost cylindrical shape and is rotated in a state in which a side surface provided with a non-slip member is caused to abut on the shaft portion, thereby rotating the shaft portion.

8. The pressure control device according to claim 7, wherein the rotating and driving portion is provided with a groove configured to increase a frictional force together with a side surface.

* * * * *